(12) United States Patent
Kyle et al.

(10) Patent No.: US 8,144,469 B2
(45) Date of Patent: Mar. 27, 2012

(54) PROCESSOR LOADING SYSTEM

(75) Inventors: Lawrence Alan Kyle, Salado, TX (US);
Laurent A. Regimbal, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 141 days.

(21) Appl. No.: 12/775,654

(22) Filed: May 7, 2010

(65) Prior Publication Data
US 2011/0273842 A1 Nov. 10, 2011

(51) Int. Cl.
*H05K 7/20* (2006.01)
(52) U.S. Cl. ....... 361/704; 361/719; 165/80.3; 174/16.3
(58) Field of Classification Search .................. None
See application file for complete search history.

(56) References Cited

U.S. PATENT DOCUMENTS

| | | | |
|---|---|---|---|
| 6,741,089 B2 * | 5/2004 | Conroy | 324/750.06 |
| 7,001,197 B2 | 2/2006 | Shirai et al. | |
| 7,083,456 B2 * | 8/2006 | Trout et al. | 439/326 |
| 7,388,751 B2 | 6/2008 | Hood et al. | |
| 7,766,691 B2 * | 8/2010 | Pandey et al. | 439/487 |
| 7,815,453 B2 * | 10/2010 | Szu | 439/331 |
| 7,896,679 B2 * | 3/2011 | Hsu et al. | 439/342 |
| 7,946,881 B2 * | 5/2011 | Hsieh et al. | 439/487 |
| 2008/0124955 A1 | 5/2008 | Szu | |
| 2009/0233474 A1 | 9/2009 | Zhou et al. | |

\* cited by examiner

*Primary Examiner* — Boris Chervinsky
(74) *Attorney, Agent, or Firm* — Haynes and Boone, LLP

(57) ABSTRACT

A component loading system includes a board having a socket, wherein the board includes a first mounting member and a pair of first heat dissipater coupling posts that extend from the board adjacent the socket. A base member defines two base member securing holes, wherein the base member is secured to the board using the pair of first heat dissipater coupling posts such that a first heat dissipater coupling post extends through each base member securing hole. A loading member includes a pair of second heat dissipater coupling posts extending from the loading member, wherein the loading member is operable to be secured to the board by coupling the loading member to the base member and securing the loading member to the board using the first mounting member, and wherein a heat dissipater is operable to be coupled to the base member and the loading member using the pair of first heat dissipater coupling posts and the pair of second heat dissipater coupling posts. The component loading system couples a component to the socket while using less board space and volume next to the board than conventional loading systems in order to provide for, for example, increased trace routing volume and closer component positioning adjacent the socket.

19 Claims, 9 Drawing Sheets

PROCESSOR LOADING SYSTEM

BACKGROUND

The present disclosure relates generally to information handling systems, and more particularly to a processor loading system for an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs include processors for use in processing, storing, and communicating information. These processors may be coupled to the IHS through a socket that is mounted to a board in the IHS. The processors typically include a plurality of pins that must be mated with the socket in order to allow the processor to function. This mating of the processor to the socket raises a number of issues.

Conventional systems and methods for mating processors with sockets include providing a board defining 4 mounting holes adjacent a socket, and then positioning 4 fasteners in a loading mechanism and the board in order to mount the loading mechanism to the board adjacent the socket. The loading mechanism also typically includes a lever that extends from the loading mechanism and over the board and is used to provide a force on the processor to mate the processor with the socket. A processor may then be placed on the socket, and the lever may be used to mate the processor with the socket. The board may also define an additional 2 to 4 mounting holes that are used to couple a heat sink or other heat dissipation device to the processor in order to cool the processor. As processors and board layouts become more complex and dense (e.g., in terms of trace routing volume), the volume and board space adjacent the socket becomes more and more valuable. By defining 6 to 8 holes in the board in order to mount the loading mechanism and heat sink, and occupying volume adjacent the socket with the lever, conventional processor loading systems use up valuable volume and board space adjacent the processor that could be utilized to, for example, route traces and/or position power components.

Accordingly, it would be desirable to provide an improved processor loading system.

SUMMARY

According to one embodiment, a component loading system includes a board having a socket, wherein the board includes a first mounting member and a pair of first heat dissipater coupling posts that extend from the board adjacent the socket, a base member that defines two base member securing holes, wherein the base member is secured to the board using the pair of first heat dissipater coupling posts such that a first heat dissipater coupling post extends through each base member securing hole, and a loading member that includes a pair of second heat dissipater coupling posts extending from the loading member on opposite sides of the loading member, wherein the loading member is operable to be secured to the board by coupling the loading member to the base member and securing the loading member to the board using the first mounting member, and wherein a heat dissipater is operable to be coupled to the base member and the loading member using the pair of first heat dissipater coupling posts and the pair of second heat dissipater coupling posts.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
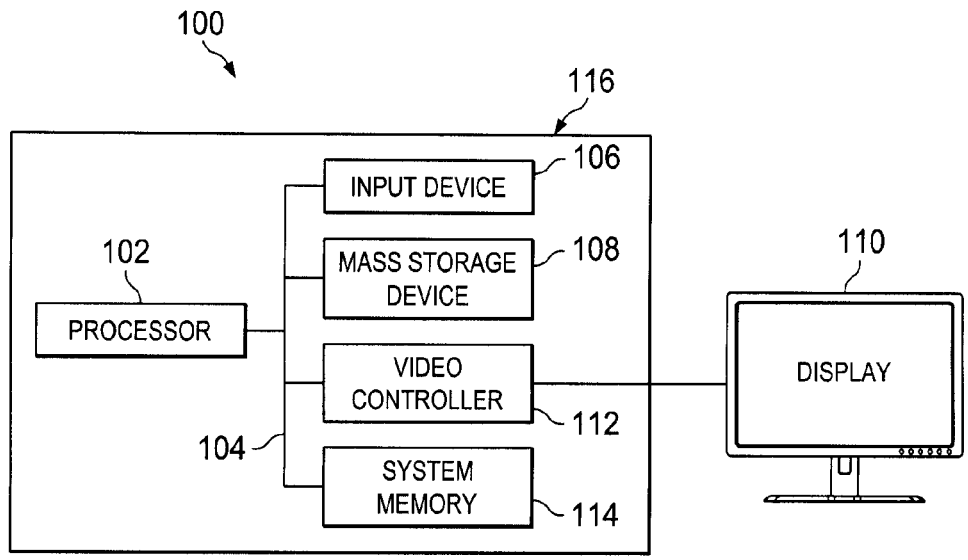
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
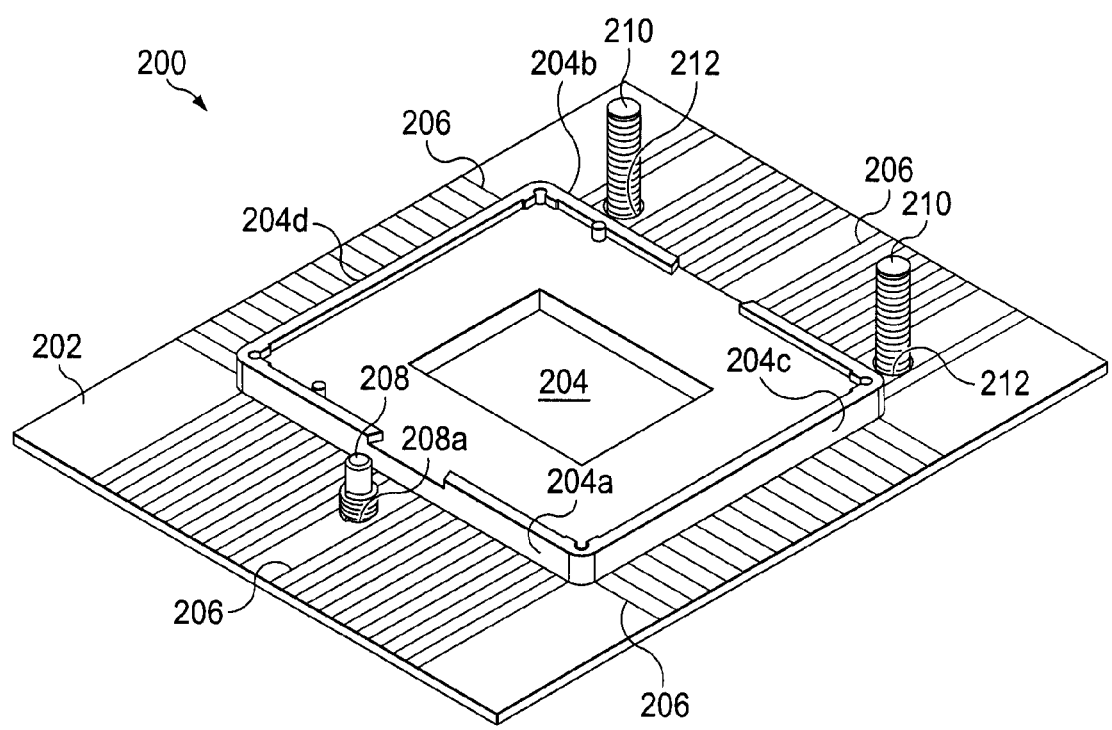
FIG. 2 is a perspective view illustrating an embodiment of a board including a socket.

Referring now to FIG. 2, a processor loading system component 200 is illustrated. In an embodiment, the processor loading system component 200 may be housed in a chassis such as, for example, the chassis 116 described above with reference to FIG. 1. In an embodiment, the processor loading system component 200 includes a board 202 that may be a Printed Circuit Board (PCB) and/or other board type known in the art. A socket 204 is mounted to the board 202 and includes a front edge 204a, a rear edge 204b located opposite the socket 204 from the front edge 204a, and a pair of opposing side edges 204c and 204d that extend between the front edge 204a and the rear edge 204b. In an embodiment, the socket 204 may be coupled to IHS components such as, for example, the memory 114, described above with reference to FIG. 1. A plurality of pins may be located on the socket 204 between the front edge 204a, the rear edge 204b, and the side edges 204c and 204d. A plurality of traces 206 are located on the board 202 and are coupled to the socket 204, the socket pins, and IHS components (e.g., the memory 114). A first mounting post 208 extends from the board 202 and located adjacent the front edge 204a of the socket 204. In an embodiment, the first mounting post 208 includes a threaded portion that is operable to couple to a threaded fastener. In an embodiment, the first mounting post 208 is coupled to the board 202 through a first mounting hole 208a defined by the board 202 adjacent the front edge 204a of the socket 204. A plurality of first heat dissipater coupling posts 210 extend from the board 202 in a spaced apart orientation from each other and adjacent the rear edge 204b of the socket 204. In an embodiment, the first heat dissipater coupling posts 210 include threaded fasteners that are coupled to the board 202 through second mounting holes 212 defined by the board 202 adjacent the rear edge 204b of the socket 204. Thus, the board 202 of the processor loading system component 200 includes only three obstructions adjacent the socket 204: either the first mounting post 208 or the first mounting hole 208a that couples the first mounting post 208 to the board 202, and either the first heat dissipater coupling posts 210 or the second mounting holes 212 that couple the first heat dissipater coupling posts 210 to the board 202.

Figure 3A:
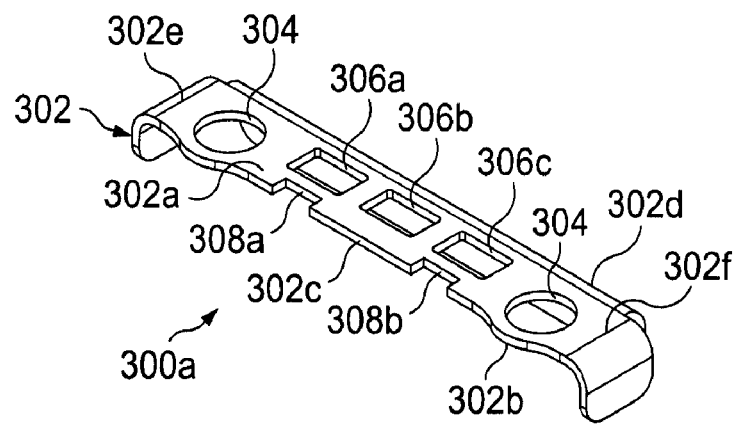
FIG. 3a is a perspective view illustrating an embodiment of a base member used with the board and socket of FIG. 2.
Figure 3B:
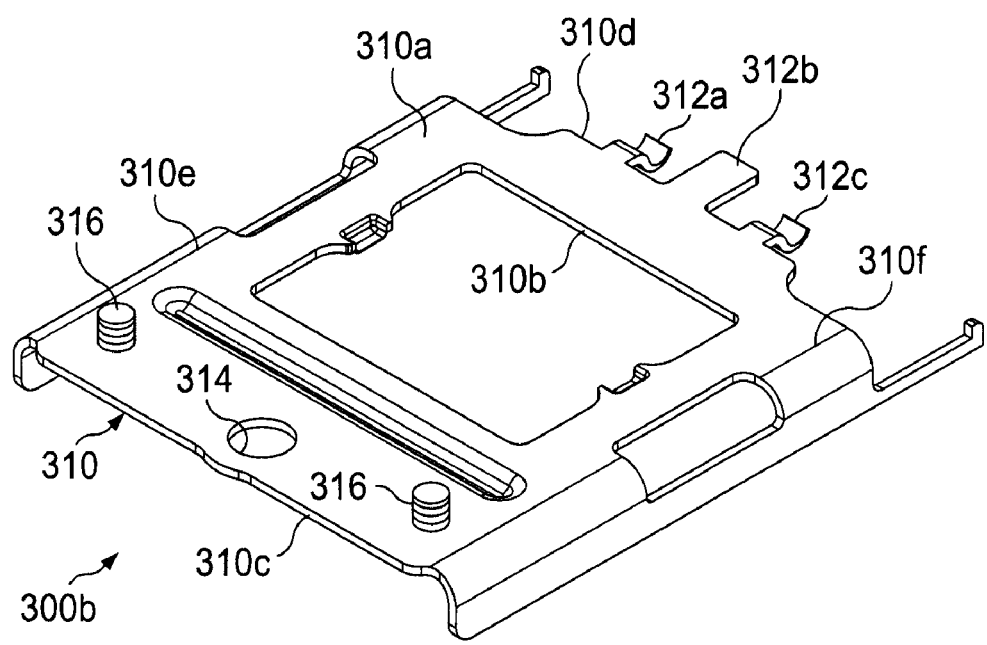
FIG. 3b is a perspective view illustrating an embodiment of a loading member used with the base member of FIG. 3a and the board and socket of FIG. 2.

Referring now to FIGS. 3a and 3b, processor loading system components 300a and 300b are illustrated. The processor loading system component 300a in FIG. 3a includes a base member 302. The base member 302 includes a top surface 302a, a bottom surface 302b located opposite the base member 302 from the top surface 302a, a front edge 302c extending between the top surface 302a and the bottom surface 302b, a rear edge 302d located opposite the front edge 302c and extending between the top surface 302a and the bottom surface 302b, and a pair of opposing side edges 302e and 302f extending between the top surface 302a, the bottom surface 302b, the front edge 302c, and the rear edge 302d. A pair of base member securing holes 304 are defined by the base member 302, extend through the base member 302 from the top surface 302a to the bottom surface 302b, and are located on the base member 302 in a spaced apart orientation from each other and adjacent the side edges 302e and 302f, respectively. Loading member coupling holes 306a, 306b and 306c are each defined by the base member 302, extend through the base member 302 from the top surface 302a to the bottom surface 302b, and are substantially centrally located on the base member 302 in a spaced apart relationship from each other and between the base member securing holes 304. A pair of loading member coupling channels 308a and 308b are defined by the base member 302, extend into the base member 302 from the front edge 302c, and are located in a spaced apart orientation from each other and adjacent the loading member coupling holes 306a and 306c, respectively.

The processor loading component 300b in FIG. 3b includes a loading member 310. The loading member 310 includes a top surface 310a, a bottom surface 310b located opposite the loading member 310 from the top surface 310a, a front edge 310c extending between the top surface 310a and the bottom surface 310b, a rear edge 310d located opposite the front edge 310c and extending between the top surface 310a and the bottom surface 310b, and a pair of opposing side edges 310e and 310f extending between the top surface 310a, the bottom surface 310b, the front edge 310c, and the rear edge 310d. A plurality of base member couplers 312a, 312b and 312c extend from a substantially central location on the rear edge 310d of the loading member 310 and in a spaced apart orientation from each other. In the illustrated embodiment, the base member coupler 312b is a substantially plane shaped while the base member couplers 312a and 312c are substantially question-mark shaped in order to provide a moveable coupling between the base member 302 and the loading member 310 (described in further detail below). The loading member 310 defines only one loading member securing hole 314 that extends through the loading member 310 from the top surface 310a to the bottom surface 310b and is located adjacent the front edge 310c in a substantially central location on the loading member 310 between the side edges 310e and 310f. A pair of second heat dissipater coupling posts 316 extend from the loading member 310 in a spaced apart orientation from each other on opposite sides of the loading member securing hole 314 and adjacent the side edges 310e and 310f, respectively. In an embodiment, the second heat dissipater coupling posts 316 include threaded fasteners.

Figure 4A:
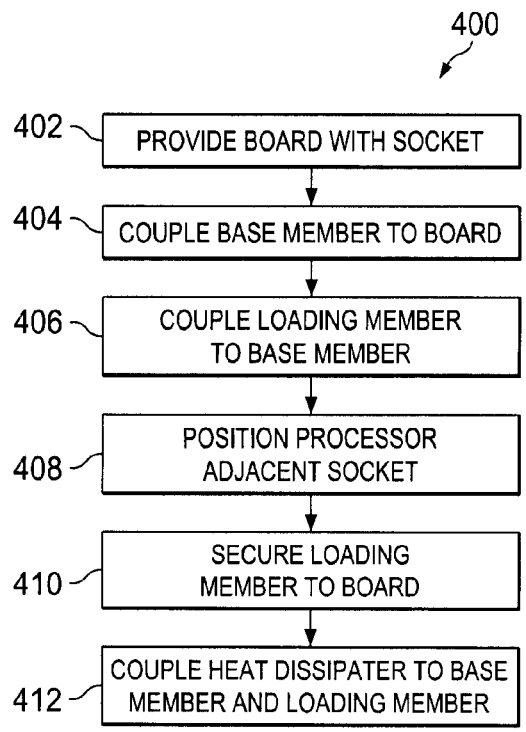
FIG. 4a is a flow chart illustrating an embodiment of a method for coupling a processor to a socket.
Figure 4B:
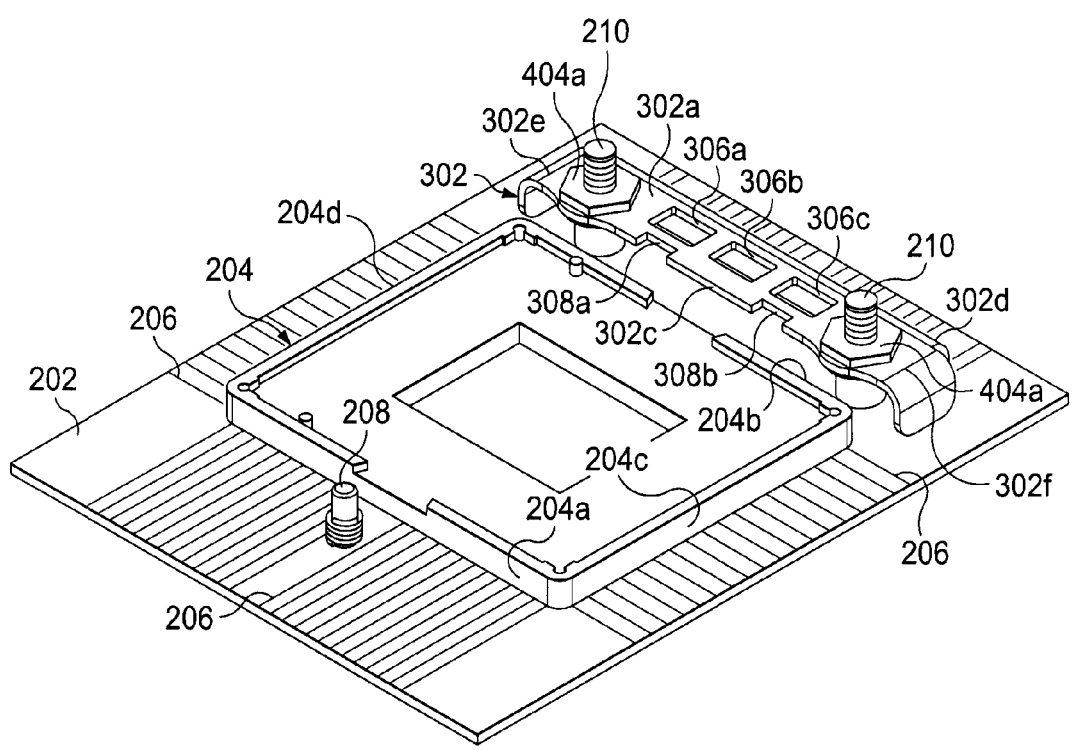
FIG. 4b is a perspective view illustrating an embodiment of the base member of FIG. 3a coupled to the board of FIG. 2.

Referring now to FIGS. 2, 3a, 4a and 4b, a method 400 for coupling a processor to a socket is illustrated. The method 400 begins at block 402 where a board with a socket is provided. In an embodiment, the processor loading system component 200 including the board 202 and the socket 204, described above with reference to FIG. 2, is provided. The method 400 then proceeds to block 404 where a base member is coupled to the board. In an embodiment, the base member 302, described above with reference to FIG. 3a, is positioned adjacent the first heat dissipater coupling posts 210 that extend from the board 202 such that the base member securing holes 304 are aligned with the first heat dissipater coupling posts 210, the bottom surface 302b of the base member 302 is facing the board 202, and the front edge 302c of the base member 302 is adjacent the socket 204. The base member 302 is then moved towards the board 202 such that the first heat dissipater coupling posts 210 extend through base member securing holes 304. In an embodiment, the base member 302 may engage the board 202 when the first heat dissipater coupling posts 210 are fully extended through the base member securing holes 304. In an embodiment, the first heat dissipater coupling posts 210 may include stops or other components that prevent the base member 302 from engaging the board 202 when the first heat dissipater coupling posts 210 are fully extended through the base member securing holes 304. Securing members such as, for example, nuts 404a, may then be coupled to the first heat dissipater coupling posts 210 in order to secure the base member 302 to the board 202, as illustrated in FIG. 4b.

Figure 4C:
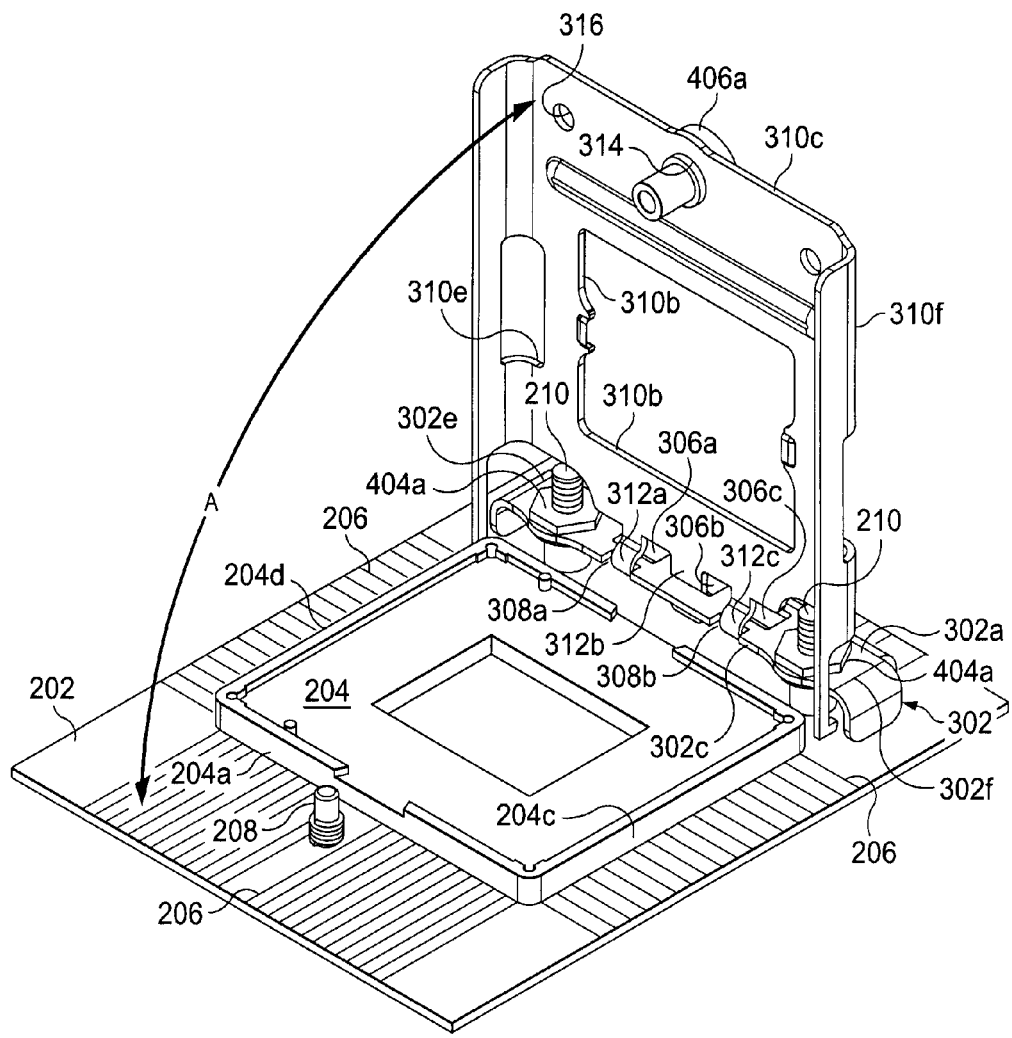
FIG. 4c is a perspective view illustrating an embodiment of the loading member of FIG. 3b coupled to the base member of FIG. 4b.
Figure 4D:
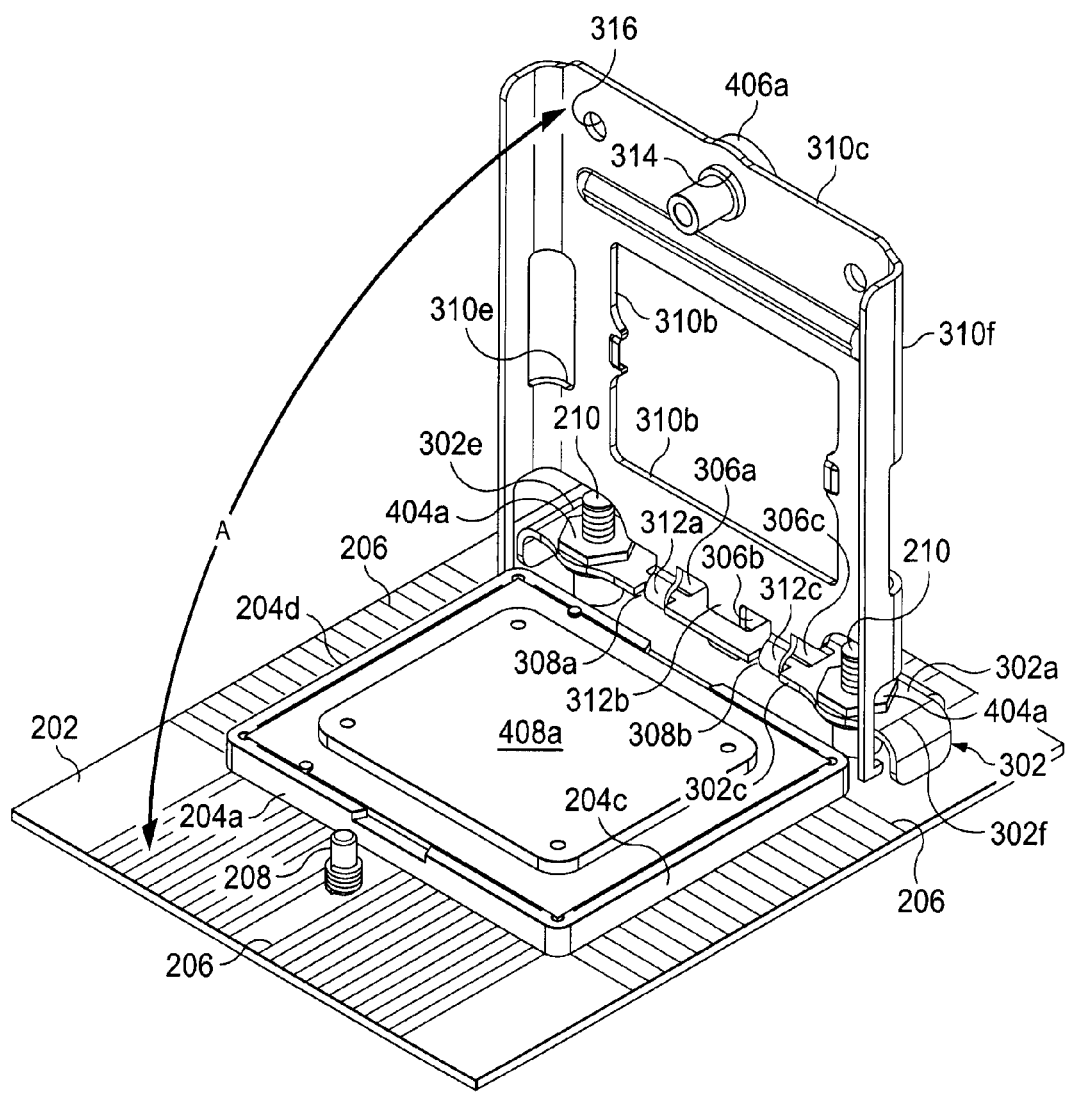
FIG. 4d is a perspective view illustrating an embodiment of a processor coupled to the socket of FIG. 4c.

Referring now to FIGS. 3b, 4a, 4c and 4d, the method 400 then proceeds to block 406 where a loading member is coupled to the base member. The loading member 310, described above with reference to FIG. 3b, is coupled to the base member 302 by positioning the base member couplers 312a and 312c in the loading member coupling channels 308a and 308b, respectively, such that the loading member 310 is oriented at an angle to the board 202 and the distal end of the base member coupler 312b is located in the loading member coupling hole 306b, as illustrated in FIG. 4c. In an embodiment, the coupling of the loading member 310 to the base member 302 is a moveable coupling that allows the loading member 310 to rotate about its coupling to the base member 302 through a range of motion A. In the illustrated embodiment, the loading member 310 includes a threaded fastener 406a that is captive to the loading member 310 through a coupling with the loading member securing hole 314. The method 400 then proceeds to block 408 where a processor is positioned adjacent the socket. A processor 408a is positioned on the socket 204 such that pins on the processor 408a (not illustrated) are aligned with pins on the socket 204 and the processor 408a sits on the socket 204, as illustrated in FIG. 4d.

Figure 4E:
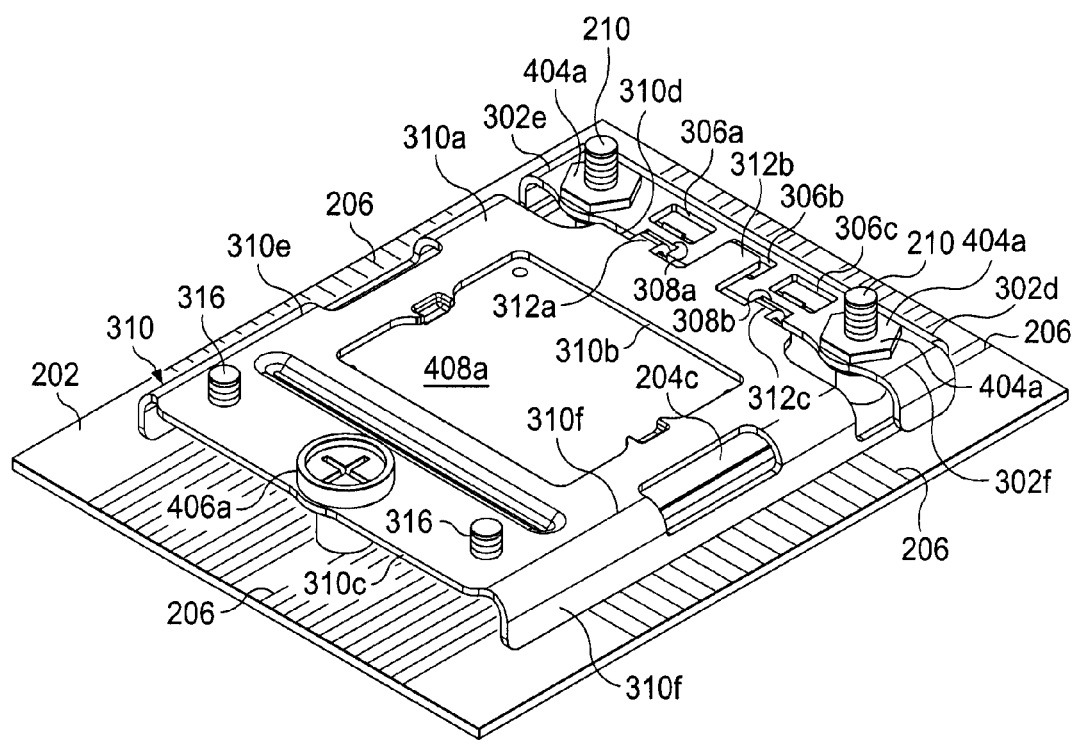
FIG. 4e is a perspective view illustrating an embodiment of the loading member of FIG. 4d rotated from the orientation illustrated in FIG. 4d and secured to the board.

Referring now to FIGS. 4a, 4d and 4e, the method 400 then proceeds to block 410 where the loading member is secured to the board. The loading member 310 is rotated through the range of motion A from the position illustrated in FIG. 4d to the position illustrated in FIG. 4e. In the position illustrated in FIG. 4e, the bottom surface 310b of the loading member 310 engages the processor 408a and the threaded fastener 406a coupled to the loading member securing hole 314 engages the first mounting post 208 that extends from the board 202. The threaded fastener 406a may then be used to secure the loading member 310 to the board 202. Securing the loading member 310 to the board 202 causes the bottom surface 310b of the loading member 310 to provide a force on the processor 408a that is sufficient to the mate the processor 408a with the socket 204.

Figure 4F:
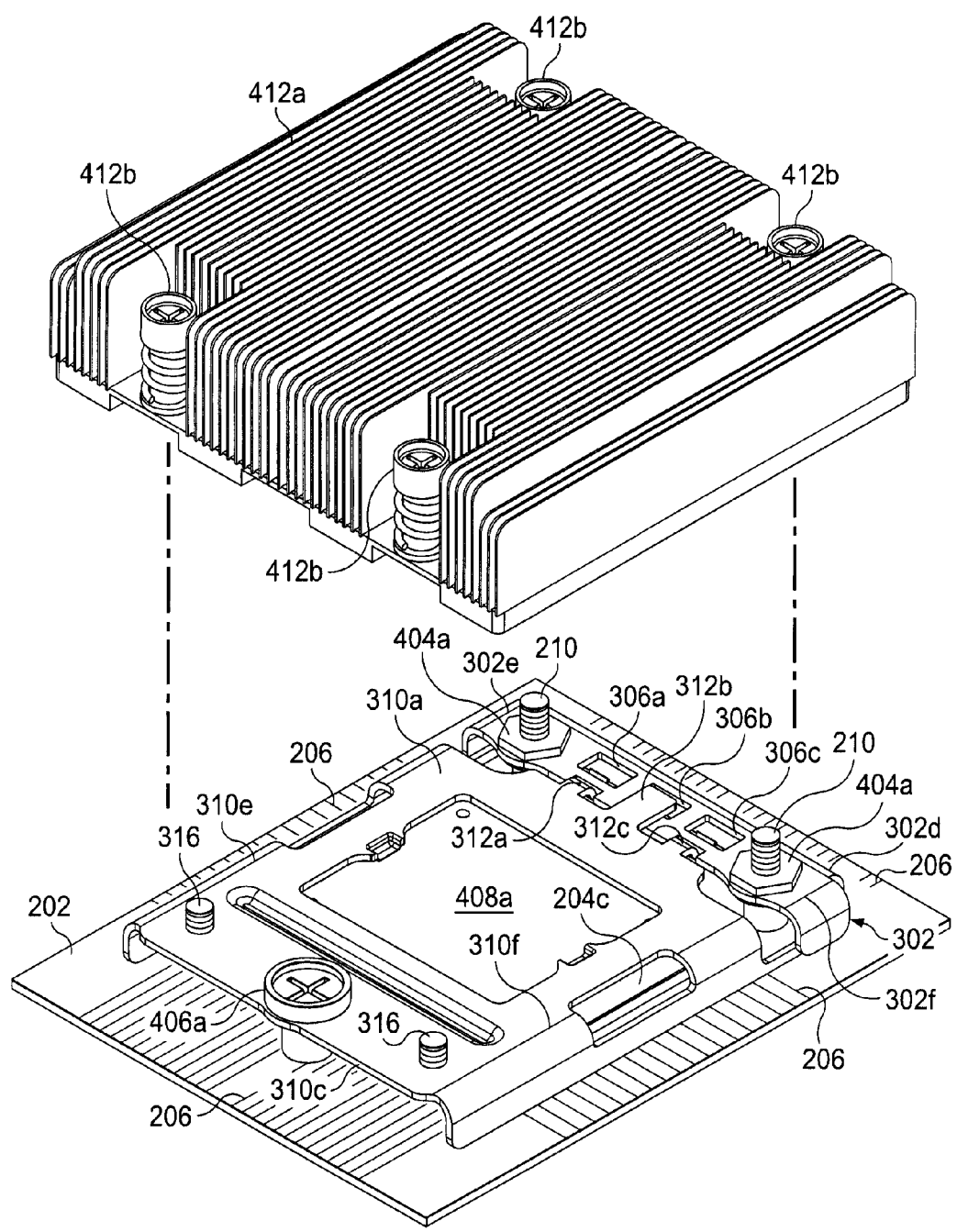
FIG. 4f is a perspective view illustrating an embodiment of a heat dissipater being coupled to the loading member and base member of FIG. 4e.
Figure 4G:
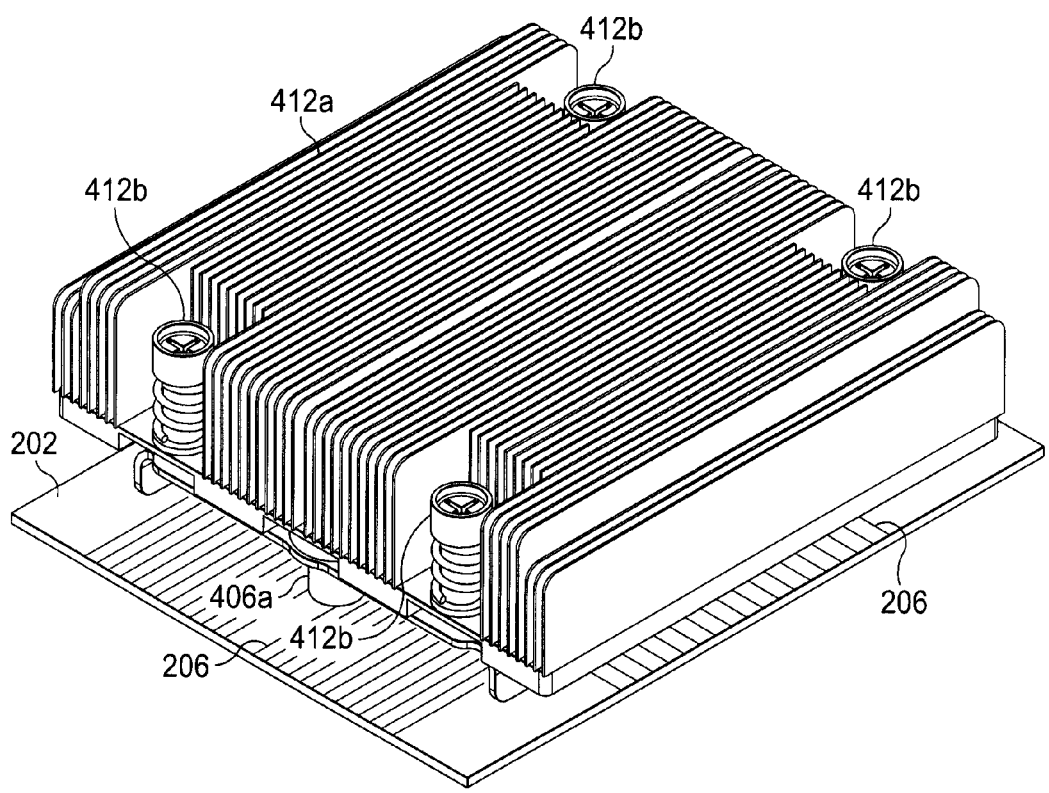
FIG. 4g is a perspective view illustrating an embodiment of the heat dissipater of FIG. 4f secured to the loading member and base member.

Referring now to FIGS. 4a, 4f and 4g, the method 400 then proceeds to block 412 where a heat dissipater is coupled to the base member and the loading member. A heat dissipater 412a (e.g., a heat sink) that includes a plurality of fasteners 412b is positioned adjacent the loading member 310 and the base member 302 such that the fasteners 412b are substantially aligned with the first heat dissipater coupling posts 210 and the second heat dissipater coupling posts 316, as illustrated in FIG. 4f. The heat dissipater 412a is then moved towards the board 202 such that the fasteners 412b engage the heat dissipater coupling posts 210 and the second heat dissipater coupling posts 316, as illustrated in FIG. 4g. The fasteners 412b may then be used to secure the heat dissipater 412a to the loading member 310a and the base member 302. With the heat dissipater 412a secured to the loading member 310 and the base member 302, the heat dissipater 412a engages the processer 406a, for example, directly or through a thermal interface material. Thus, a system and method have been described that limit the obstructions on a board adjacent a socket to a first mounting member (or first mounting hole) and a pair of first heat dissipater coupling posts (or a pair of second mounting holes). Limiting obstructions on a board adjacent a socket allow for the provision of, for example, increased trace routing density. The system and method described also provides for coupling a heat dissipater to the processor without creating any additional obstructions on the board adjacent the socket. The system and method described also eliminate a convention lever that extends into the volume adjacent the socket and is used for providing a force to mate the processor with the socket. Eliminating such levers allows power components such as, for example, voltage regulators, to be positioned closer to the socket (e.g., immediately adjacent the socket) than is possible with conventional processor loading systems in order to improve power delivery efficiency.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component loading system, comprising:
  a board comprising a socket, wherein the board includes a first mounting member and a pair of first heat dissipater coupling posts that extend from the board adjacent the socket;
  a base member that defines two base member securing holes, wherein the base member is secured to the board using the pair of first heat dissipater coupling posts such that a first heat dissipater coupling post extends through each base member securing hole; and
  a loading member that includes a pair of second heat dissipater coupling posts extending from the loading member, wherein the loading member is operable to be secured to the board by coupling the loading member to the base member and securing the loading member to the board using the first mounting member, and wherein a heat dissipater is operable to be coupled to the base member and the loading member using the pair of first heat dissipater coupling posts and the pair of second heat dissipater coupling posts.

2. The system of claim 1, wherein loading member is operable to be moveably coupled to the base member.

3. The system of claim 1, wherein the first mounting member extends through a first mounting hole that is defined by the board adjacent the socket, and the pair of first heat dissipater coupling posts extend through a pair of second mounting holes that are defined by the board adjacent the socket.

4. The system of claim 1, wherein the pair of first heat dissipater coupling posts and the pair of second heat dissipater coupling posts are operable to couple to threaded fasteners.

5. The system of claim 1, further comprising:
  a plurality of traces located on the board and coupled to the socket.

6. The system of claim 1, further comprising:
a heat producing component that is operable to be mated with the socket.

7. The system of claim 6, wherein loading member is operable to apply a force to the heat producing component sufficient to mate the heat producing component with the socket when the heat producing component is positioned on the socket and the loading member is secured to the board.

8. The system of claim 7, wherein the heat dissipation device is operable to be thermally coupled to the heat producing component when the heat producing component is mated with the socket and the heat dissipation device is coupled to the base member and the loading member.

9. An information handling system, comprising:
a chassis housing a board that comprises a socket and includes a first mounting member and a pair of first heat dissipater coupling posts that extend from the board adjacent the socket;
a processor coupled to the socket, wherein the processor is mated to the socket with a processor loading system comprising:
  a base member that defines two base member securing holes, wherein the base member is secured to the board using the pair of first heat dissipater coupling posts such that a first heat dissipater coupling post extends through each base member securing hole;
  a loading member that includes a pair of second heat dissipater coupling posts extending from the loading member, wherein the loading member is secured to the board to mate the processor to the socket by a coupling between the loading member and the base member and a coupling between the loading member and the first mounting member; and
  a heat dissipater coupled to the base member and the loading member using the pair of first heat dissipater coupling posts and the pair of second heat dissipater coupling posts such that the heat dissipater is thermally coupled the processor.

10. The system of claim 9, further comprising:
a plurality of traces located on the board and coupled to the socket.

11. The system of claim 9, wherein the coupling between the loading member and the base member comprises a moveable coupling.

12. The system of claim 9, wherein the first mounting member extends through a first mounting hole that is defined by the board adjacent the socket, and the pair of first heat dissipater coupling posts extend through a pair of second mounting holes that are defined by the board adjacent the socket.

13. The system of claim 9, wherein the pair of first heat dissipater coupling posts and the pair of second heat dissipation coupling posts are operable to couple to threaded fasteners.

14. The system of claim 9, wherein loading member applies a force to the processor that is sufficient to mate the processor to the socket when the loading member is secured to the board.

15. A method for coupling a processor to a socket, comprising:
providing a board that comprises a socket and includes a first mounting member and a pair of first heat dissipater coupling posts that extend from the board adjacent the socket, wherein a base member that defines two base member securing holes is secured to the board using the pair of first heat dissipater coupling posts such that a first heat dissipater coupling post extends through each base member securing hole;
positioning a processor adjacent the socket;
coupling a loading member to the base member and securing the loading member to the board using the first mounting member, wherein the coupling and securing provides a force on the processor sufficient to mate the processor to the socket; and
coupling a heat dissipater to the base member using the pair of first heat dissipater coupling posts, and coupling the heat dissipater to the loading member using a pair of second heat dissipater coupling posts that extend from the loading member.

16. The method of claim 15, wherein coupling the loading member to the base member comprises moveably coupling the loading member to the base member.

17. The method of claim 15, wherein the first mounting member extends through a first mounting hole that is defined by the board adjacent the socket, and the pair of first heat dissipater coupling posts extend through a pair of second mounting holes that are defined by the board adjacent the socket.

18. The method of claim 15, wherein the pair of first heat dissipater coupling posts and the pair of second heat dissipater coupling posts are operable to couple to threaded fasteners.

19. The method of claim 15, wherein a plurality of traces are located on the board and coupled to the socket.

* * * * *